United States Patent
Tamura

(10) Patent No.: US 11,996,313 B2
(45) Date of Patent: May 28, 2024

(54) MEMBER FOR SEMICONDUCTOR MANUFACTURING APPARATUS

(71) Applicant: NGK INSULATORS, LTD., Nagoya (JP)

(72) Inventor: Ryuji Tamura, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 218 days.

(21) Appl. No.: 17/644,361

(22) Filed: Dec. 15, 2021

(65) Prior Publication Data

US 2022/0108909 A1    Apr. 7, 2022

Related U.S. Application Data

(63) Continuation of application No. PCT/JP2020/028876, filed on Jul. 28, 2020.

(30) Foreign Application Priority Data

Aug. 8, 2019   (JP) .................... 2019-146413

(51) Int. Cl.
*H01L 21/683*   (2006.01)
*H01J 37/32*    (2006.01)
*H05B 3/28*     (2006.01)

(52) U.S. Cl.
CPC .... *H01L 21/6833* (2013.01); *H01J 37/32724* (2013.01); *H01J 2237/2007* (2013.01); *H05B 3/283* (2013.01); *H05B 2203/016* (2013.01)

(58) Field of Classification Search
CPC .......................... H01L 21/6831; H01L 21/6833
See application file for complete search history.

(56) References Cited

U.S. PATENT DOCUMENTS

2010/0163188 A1   7/2010   Tanaka et al.
2011/0005686 A1   1/2011   Tanaka et al.
(Continued)

FOREIGN PATENT DOCUMENTS

JP    2005-197391 A    7/2005
JP    2009-054871 A    3/2009
(Continued)

OTHER PUBLICATIONS

Japanese Office Action (Application No. 2021-537246) dated May 9, 2023 (with English translation) (7 pages).
(Continued)

*Primary Examiner* — Jared Fureman
*Assistant Examiner* — Christopher J Clark
(74) *Attorney, Agent, or Firm* — BURR PATENT LAW, PLLC

(57) ABSTRACT

A member for semiconductor manufacturing apparatus has a structure in which a hollow ceramic shaft is provided on a back surface of a ceramic plate having a front surface serving as a wafer placement surface. The member for semiconductor manufacturing apparatus includes an RF electrode embedded in the ceramic plate, an RF connector disposed outside of the hollow interior of the ceramic shaft, and an RF link member provided between the RF connector and the RF electrode. The RF link member has a branching portion consisting of a plurality of RF rods, and the branching portion extends to the outside of the ceramic shaft.

8 Claims, 4 Drawing Sheets

(56) References Cited

U.S. PATENT DOCUMENTS

| | | |
|---|---|---|
| 2013/0248509 A1 | 9/2013 | Unno et al. |
| 2015/0194326 A1* | 7/2015 | Zhou ................ H01L 21/68792 |
| | | 156/345.48 |
| 2015/0243483 A1 | 8/2015 | Chen et al. |
| 2016/0225651 A1 | 8/2016 | Tran et al. |
| 2016/0336174 A1 | 11/2016 | Underwood et al. |
| 2017/0352567 A1* | 12/2017 | Cho .................. H01J 37/32724 |
| 2018/0218885 A1 | 8/2018 | Maeda et al. |
| 2019/0355556 A1 | 11/2019 | Takahashi |
| 2020/0013586 A1* | 1/2020 | Ma .......................... C23C 16/46 |

FOREIGN PATENT DOCUMENTS

| | | |
|---|---|---|
| JP | 2010-109316 A | 5/2010 |
| JP | 2012-089694 A | 5/2012 |
| JP | 2015-159283 A | 9/2015 |
| JP | 2016-184642 A | 10/2016 |
| JP | 2017-505382 A | 2/2017 |
| JP | 2017-511980 A | 4/2017 |
| JP | 2018-506853 A | 3/2018 |
| JP | 2018-123348 A | 8/2018 |
| KR | 10-2013-0107229 A | 10/2013 |
| KR | 10-2016-0105470 A | 9/2016 |
| WO | 2018/163935 A1 | 9/2018 |

OTHER PUBLICATIONS

English translation of the International Preliminary Report on Patentability (Chapter 1) dated Feb. 8, 2022 (Application No. PCT/JP2020/028876).

International Search Report and Written Opinion (Application No. PCT/JP2020/028876) dated Oct. 13, 2020 (with English translation).

Taiwanese Office Action (Application No. 109125764) dated Mar. 29, 2021.

Korean Office Action (with English translation) dated Oct. 8, 2023 (Application No. 10-2022-7000620).

Korean Third Party Submission dated Feb. 19, 2024 (Application No. 10-2022-7000620).

\* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

In some semiconductor manufacturing apparatuses, such as etching apparatuses and CVD apparatuses, there has been used a member for semiconductor manufacturing apparatus having a structure in which a cylindrical ceramic shaft is connected to a back surface of a disk-shaped ceramic plate having a front surface serving as a wafer placement surface. Some of the members for semiconductor manufacturing apparatus have a high-frequency electrode (an RF electrode) embedded in a ceramic plate and generates plasma by using the RF electrode. For example, in a member for semiconductor manufacturing apparatus described in PTL 1, a plurality of RF rods are connected to an RF electrode, and the plurality of RF rods branch off from a single RF connector disposed in the hollow interior of the ceramic shaft. Since in PTL 1, a plurality of RF rods are provided instead of a single RF rod, the current flowing per RF rod can be reduced, and the amount of heat generated per RF rod is accordingly reduced. For this reason, a hot spot is less likely to occur in the ceramic plate.

CITATION LIST

Patent Literature

PTL 1: Japanese Unexamined Patent Application Publication No. 2016-184642

SUMMARY OF THE INVENTION

However, when an RF connector is disposed in the hollow interior of the ceramic shaft as in PTL 1, the temperature in the hollow interior of the ceramic shaft may increase due to the heat generated by the RF connector. In such a case, even if the amount of heat generated by the RF rod is small, the temperature of the RF rod is likely to rise, and a hot spot may occur in the ceramic plate.

To solve the issue, it is an object of the present invention to reliably prevent the occurrence of a hot spot in a ceramic plate in a member for semiconductor manufacturing apparatus including a plurality of RF rods.

A member for semiconductor manufacturing apparatus of the present invention is a member having a structure in which a hollow ceramic shaft is provided on a back surface of a ceramic plate having a front surface serving as a wafer placement surface, the member includes: an RF electrode embedded in the ceramic plate; an RF connector disposed outside of a hollow interior of the ceramic shaft; and an RF link member provided between the RF connector and the RF electrode, wherein the RF link member has a branching portion consisting of a plurality of RF rods, and the branching portion extends to the outside of the ceramic shaft.

In the member for semiconductor manufacturing apparatus, the RF link member has a branching portion consisting of a plurality of RF rods. This increases the surface area of the current flow path of the RF link member, thus decreasing the increase in resistance due to the skin effect. In addition, since the current flowing per RF rod is reduced, the amount of heat generated per RF rod is reduced. In addition, the RF connector is disposed outside of the hollow interior of the ceramic shaft. For this reason, even if the RF connector generates heat, the temperature in the hollow interior of the ceramic shaft does not increase. Therefore, a situation does not occur where the temperature of the RF rod disposed inside of the hollow interior of the ceramic shaft is likely to increase. As a result, according to the member for semiconductor manufacturing apparatus of the present invention, the occurrence of a hot spot in the ceramic plate can be reliably prevented.

In the member for semiconductor manufacturing apparatus according to the present invention, the plurality of RF rods may be merged into one rod in a first merged portion in front of the back surface of the ceramic plate, and the one rod may be connected to the RF electrode. In this way, the number of holes formed in the ceramic plate can be reduced when the RF link member is connected to the RF electrode.

In the member for semiconductor manufacturing apparatus according to the present invention, the plurality of RF rods may be individually connected to the RF electrode. In this way, even if one of the plurality of RF rods is disconnected from the RF electrode for some reason, electric power can be supplied to the RF electrode from the other RF rods.

In the member for semiconductor manufacturing apparatus according to the present invention, the RF electrode may be provided across a plurality of planes at different heights within the ceramic plate. In this way, the density of the plasma can be changed for each plane of the RF electrode at a different height. In this case, each of the plurality of RF rods may be individually connected to one of the planes of the RF electrode. In this way, the distance between the RF rods can be ensured. For example, by increasing the distance between the RF rods that generate heat, it is possible to prevent the RF rods from heating each other. In addition, since the RF rods are connected to the RF electrode close to the back surface of the ceramic plate and the RF electrode far from the back surface of the ceramic plate, the depth of the hole of the RF rod connected to the RF electrode close to the back surface of the ceramic plate is small, which reduces the load of processing performed on the ceramic plate and reduces the risk of breakage. In contrast, when a plurality of the RF rods are connected to the RF electrode far from the back surface of the ceramic plate, the depth of the holes of the RF rods is large, which increases the load of processing performed on the ceramic plate and increases the risk of breakage.

In the member for semiconductor manufacturing apparatus according to the present invention, the plurality of RF rods may be merged into one rod in a second merged portion in front of the RF connector, and the one rod may be connected to the RF connector. In this way, when the RF link member is connected to the RF connector, the number of connection points between the RF link member and the RF connector can be reduced.

In the member for semiconductor manufacturing apparatus according to the present invention, the cross section obtained by cutting the RF rod in a direction perpendicular to the longitudinal direction of the RF rod may have a shape with at least one concave portion in the periphery of the shape. In this way, the surface area of the RF rod is increased, as compared with an RF rod without the concave portion, which decreases the increase in resistance due to the skin effect more. As a result, the amount of heat generated per RF rod is reduced more.

The member for semiconductor manufacturing apparatus according to the present invention may further include a resistance heating element embedded in the ceramic plate and a pair of heater rods that are connected to the resistance heating element and that extend through the hollow interior of the ceramic shaft to the outside of the ceramic shaft. The base end of the RF link member may be located at a position closer to the ceramic shaft than the base ends of the heater rods. In this way, the length of the part of the RF link member that generates heat is decreased, resulting in less heat generation. Furthermore, the work performed on the base end of the RF link member and the work performed on the base end of the heater rod are less likely to interfere with each other. As a result, each of the works can be smoothly performed. In addition, since the length of the RF link member can be relatively decreased, the resistance of the RF link member can be kept low, thus decreasing the amount of heat generated by the RF link member.

The member for semiconductor manufacturing apparatus according to the present invention may further include a resistance heating element embedded in the ceramic plate and a pair of heater rods that are connected to the resistance heating element and that extend through the hollow interior of the ceramic shaft to the outside of the ceramic shaft. The RF rod may be thicker than each of the heater rods. That is, it is desirable that the diameter of the RF rod be greater than that of the heater rod. This increases the surface area of the RF rods, which decreases the resistance of the RF current flowing through the RF rods. As a result, the amount of heat generated per RF rod is reduced more. Note that when the member for semiconductor manufacturing apparatus has the first merged portion, it is desirable that the diameter of the first merged portion be greater than that of the heater rod. When the member for semiconductor manufacturing apparatus has the second merged portion, it is desirable that the diameter of the second merged portion be greater than that of the heater rod.

DETAILED DESCRIPTION OF THE INVENTION

Figure 1:
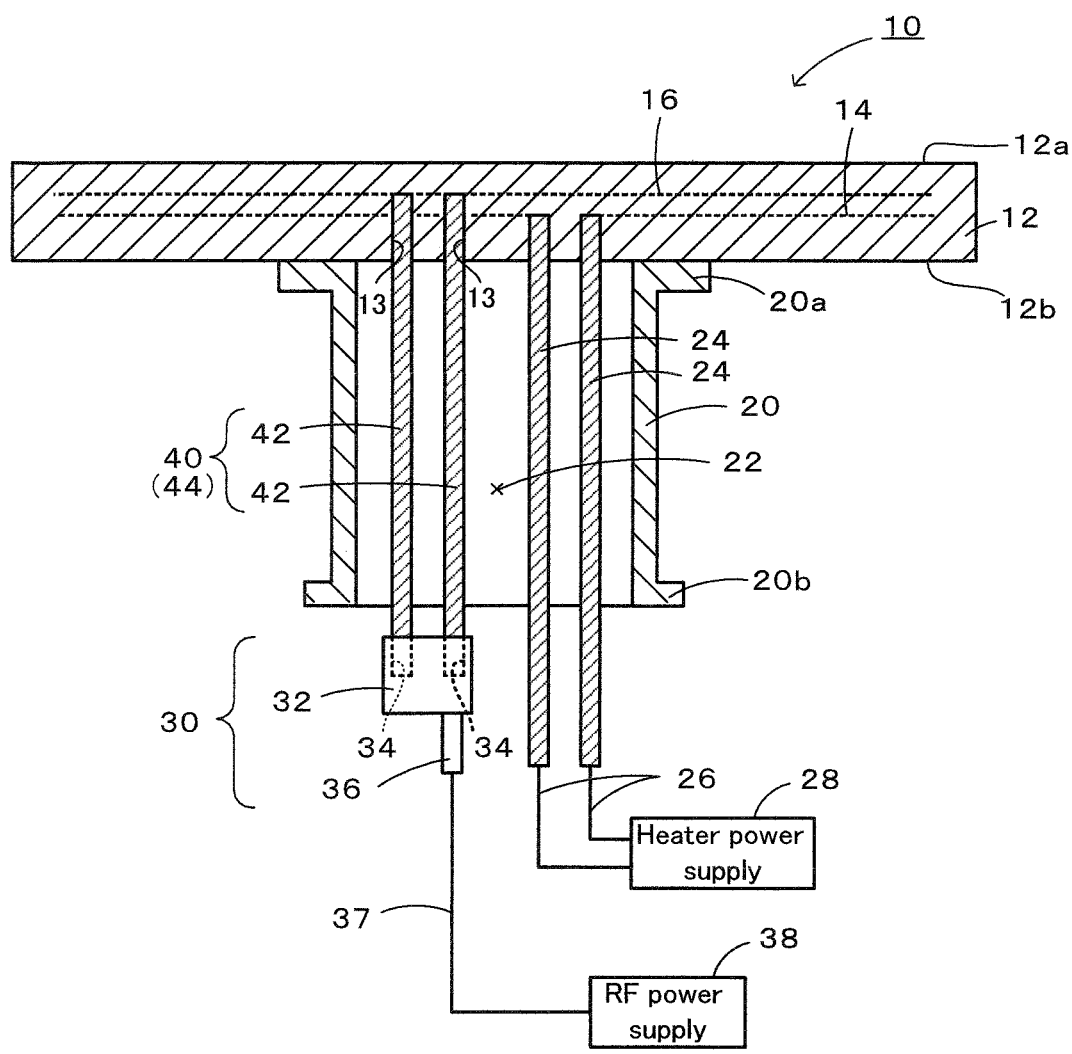
FIG. 1 is a longitudinal sectional view of a ceramic heater 10.

An exemplary embodiment of the present invention is described below with reference to the accompanying drawings. FIG. 1 is a longitudinal sectional view of a ceramic heater 10.

Note that the terms "up" and "down" as used in the specification are intended to indicate a relative positional relationship, not an absolute positional relationship. Accordingly, the terms "up" and "down" may change to "down" and "up", "left" and "right", or "front" and "rear", respectively, depending on the orientation of the ceramic heater 10.

The ceramic heater 10 is one of the members for semiconductor manufacturing apparatus. The ceramic heater 10 is used to support and heat a wafer to be processed through, for example, CVD or etching using plasma. The ceramic heater 10 is installed inside a chamber for a semiconductor process (not illustrated). The ceramic heater 10 includes a ceramic plate 12, a ceramic shaft 20, heater rods 24, an RF connector 30, and an RF link member 40.

The ceramic plate 12 is a disc-shaped member that contains AlN as its main component. The ceramic plate 12 has a wafer placement surface 12a that enables a wafer to be placed thereon. A ceramic shaft 20 is joined to a surface opposite to the wafer placement surface 12a (a back surface 12b) of the ceramic plate 12. The ceramic plate 12 has a resistance heating element 14 and an RF electrode 16 embedded therein. The resistance heating element 14 is formed by wiring a coil that contains Mo as its main component over the whole area of the ceramic plate 12 in a one-stroke pattern so as to be substantially parallel to the wafer placement surface 12a. The RF electrode 16 is a thin layer electrode in the shape of a disk with a slightly smaller diameter than the ceramic plate 12. The RF electrode 16 is formed by a sheet mesh of thin metal wires containing Mo as its main component. The RF electrode 16 is embedded in the ceramic plate 12 between the resistance heating element 14 and the wafer placement surface 12a so as to be substantially parallel to the wafer placement surface 12a. The reason why Mo is selected as the material of the resistance heating element 14 and RF electrode 16 is because Mo has a thermal expansion coefficient close to that of AlN, which is the main component of the ceramic plate 12, and is less likely to crack when the ceramic plate 12 is manufactured. Even a material other than Mo can be used for the resistance heating element 14 and RF electrode 16, as long as the material is a conductive material having a thermal expansion coefficient close to that of AlN. A thermocouple (not illustrated) that detects the temperature of the ceramic plate 12 is inserted into a region of the back surface 12b of the ceramic plate 12 surrounded by the ceramic shaft 20.

The ceramic shaft 20 is a cylindrical member containing AlN as its main component. The ceramic shaft 20 has a first flange 20a around an upper opening and a second flange 20b around a lower opening. The end face of the first flange 20a is joined to the back surface 12b of the ceramic plate 12 by solid phase bonding. The end face of the second flange 20b is fixed to a chamber (not illustrated).

The heater rods 24 are made of a metal, such as Mo, and each has a circular cross section. The upper end of one of the pair of heater rods 24 is joined to one end of the resistance heating element 14, and the upper end of the other heater rod 24 is joined to the other end of the resistance heating element 14. The lower ends of the two heater rods 24 are exposed to the outside of a hollow interior 22 of the ceramic shaft 20 and are connected to a heater power supply 28 via cables 26. According to the present embodiment, the heater power supply 28 is an AC power supply. However, a DC power supply may be employed as the heater power supply 28.

The RF connector 30 is located outside of (under) the hollow interior 22 of the ceramic shaft 20. The RF connector 30 includes a socket 32 and an RF base rod 36. The socket 32 is a substantially cuboid or columnar member made of a conductive metal, such as Ni. The upper surface of the socket 32 has two insertion holes 34 that allow insert RF rods 42 of the RF link member 40 to be inserted thereinto. Each of the insertion holes 34 holds one of the inserted RF rods 42. The RF base rod 36 is a rod made of a conductive metal, such as Ni, and is integrated with the lower surface of the socket 32. The RF base rod 36 is connected to an RF power supply 38 via a cable 37.

The RF link member 40 has a branching portion 44 consisting of a plurality of RF rods 42 (two RF rods in this example). Each of the RF rods 42 has a circular cross section and is made of a conductive metal, such as Ni. The upper ends of the plurality of branched RF rods 42 pass through through-holes 13 formed in the back surface 12b of the ceramic plate 12 and are connected to the RF electrode 16. In addition, the lower ends of the branched RF rods 42 are inserted into insertion holes 34 of the RF connector 30. According to the present embodiment, the RF link member 40 is the branching portion 44, which extends from the RF electrode 16 to the RF connector 30 through the hollow interior 22 of the ceramic shaft 20. Thus, part of the branching portion 44 is disposed in the hollow interior 22 of the ceramic shaft 20. The RF link member 40 is connected to the RF power supply 38 via the RF connector 30 and the cable 37. The lower end of the RF rod 42 is located at a position closer to the ceramic shaft 20 than the lower end of the heater rod 24. No heater rod 24 is disposed between the RF rods 42. The distance between the RF rods 42 is greater than or equal to the diameter of the RF rod 42.

An example of the usage of the ceramic heater 10 is described below. The ceramic heater 10 is disposed in a chamber (not illustrated), and a wafer is placed on the wafer placement surface 12a. Thereafter, the wafer is heated by applying the voltage of the heater power supply 28 to the resistance heating element 14 via the cable 26 and the heater rod 24. More specifically, the temperature of the wafer is obtained on the basis of the detection signal of a thermocouple (not illustrated), and the voltage applied to the resistance heating element 14 is controlled such that the temperature reaches the set temperature (e.g., 350° C. or 300° C.). In addition, the AC high-frequency voltage of the RF power supply 38 is applied to the RF electrode 16 via the cable 37, the RF connector 30, and the RF link member 40 to generate plasma between parallel plate electrodes consisting of a counter horizontal electrode (not illustrated) provided in the upper section of the chamber and the RF electrode 16 embedded in the ceramic plate 12, and CVD film formation or etching is performed by using the generated plasma. If a DC voltage is applied to the RF electrode 16, the RF electrode 16 can be used as an electrostatic electrode (an ESC electrode).

In the ceramic heater 10 described in detail above, the RF link member 40 has the branching portion 44 consisting of the plurality of RF rods 42. For this reason, the surface area of the current flow path of the RF link member 40 increases and, thus, an increase in resistance due to the skin effect can be reduced. In addition, since the amount of current flowing per RF rod is reduced, the amount of heat generated per RF rod is reduced. In addition, the RF connector 30 is disposed outside of the hollow interior 22 of the ceramic shaft 20. For this reason, even if the RF connector 30 generates heat, the temperature in the hollow interior 22 of the ceramic shaft 20 does not increase, which does not cause a situation where the temperature of the RF rod 42 disposed in the hollow interior 22 of the ceramic shaft 20 tends to increase. As a result, the ceramic heater 10 can reliably prevent the occurrence of a hot spot on the ceramic plate 12. Furthermore, since the RF connector 30 is disposed outside of the hollow interior 22 of the ceramic shaft 20, the connection work between the RF link member 40 and the RF connector 30 can be smoothly performed.

In addition, the plurality of RF rods 42 are individually connected to the RF electrode 16. For this reason, even if one of the RF rods 42 is disconnected from the RF electrode 16 for some reason, the power can be supplied to the RF electrode 16 from the other RF rods 42. Furthermore, since the plurality of RF rods 42 are connected to the RF electrode 16, the amount of heat generated can be reduced without causing an increase in resistance due to the skin effect.

Furthermore, the base end (the lower end) of the RF link member 40 is located at a position closer to the ceramic shaft 20 than the base end (the lower end) of the heater rod 24. For this reason, the work performed on the base end of the RF link member 40 and the work performed on the base end of the heater rod 24 are less likely to interfere with each other. As a result, each of the works can be smoothly performed. In addition, since the length of the RF link member 40 can be relatively decreased, the resistance of the RF link member 40 can be kept low, thus decreasing the amount of heat generated by the RF link member 40. Furthermore, since no high-frequency current flows through the heater rod 24, the heater rod 24 has no skin effect. As a result, the resistance of the heater rod 24 is lower than that of the RF rod 42. For this reason, the amount of heat generated by the heater rod 24 hardly increases even when the length of the heater rod 24 is increased.

Furthermore, the effect of noise decreases with increasing distance from the noise source. For this reason, by not placing the heater rod 24 between the RF rods 42, the variation in the voltage applied to the heater rods 24 due to the influence of the high-frequency voltage applied to the RF rods 42 is less likely to occur.

Furthermore, the distance between the RF rods 42 is greater than or equal to the diameter of the RF rod 42, and the plurality of RF rods 42 are arranged with sufficient spacing. As a result, one of the RF rods 42 is less likely to be influenced by the heat generated by the other RF rods 42.

Still furthermore, it is desirable that the RF rod 42 be thicker than the heater rod 24 (the diameter of the RF rod 42 be greater than the diameter of the heater rod 24). In this way, the surface area of the RF rod 42 increases, which decreases the resistance of the RF current flowing through the RF rod 42. As a result, the amount of heat generated per RF rod is decreased more.

The present invention is not limited to the above-described embodiment, and can be carried out by various modes as long as they belong to the technical scope of the invention.

Figure 2:
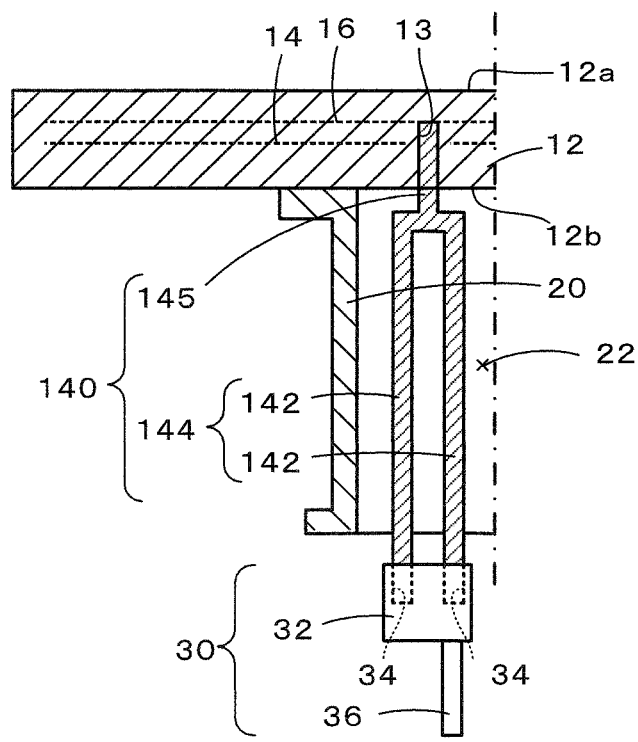
FIG. 2 is a longitudinal sectional view of an RF link member 140 and its vicinity.

For example, instead of the RF link member 40 according to the embodiment described above, an RF link member 140 illustrated in FIG. 2 may be employed. The same reference numerals are used in FIG. 2 to describe those constituent elements that are identical to the constituent elements in the embodiment described above. The RF link member 140 includes a branching portion 144 consisting of a plurality of RF rods 142 (two RF rods in this example) and a columnar merged portion 145 in which the plurality of RF rods 142 are merged into one in front of the back surface 12b of the ceramic plate 12. The lower ends of the branched RF rods 142 are inserted into the insertion holes 34 of the RF connector 30. The upper ends of the RF rods 142 are merged into a single rod at the merged portion 145, which is connected to the RF electrode 16. The RF link member 140 extends from the RF electrode 16 to the RF connector 30 through the hollow interior 22 of the ceramic shaft 20. Part of the branching portion 144 is located in the hollow interior 22 of the ceramic shaft 20. The lower end of the RF link member 140 is at a position closer to the ceramic shaft 20 than the lower end of the heater rod 24 (refer to FIG. 1). In FIG. 2, most of the RF link member 140 consists of the plurality of RF rods 142, thus reducing heat generation. In addition, when the RF link member 140 is connected to the RF electrode 16, the number of required holes 13 in the ceramic plate 12 can be reduced. It is desirable that each of the RF rod 142 and the merged portion 145 be thicker than the heater rod 24. In this way, the surface area of each of the RF rod 142 and the merged portion 145 is increased, which decreases the resistance of the RF current flowing through the RF rod 142 and the merged portion 145. As a result, the amount of heat generated by the RF rod 142 and the merged portion 145 decreases.

Figure 3:
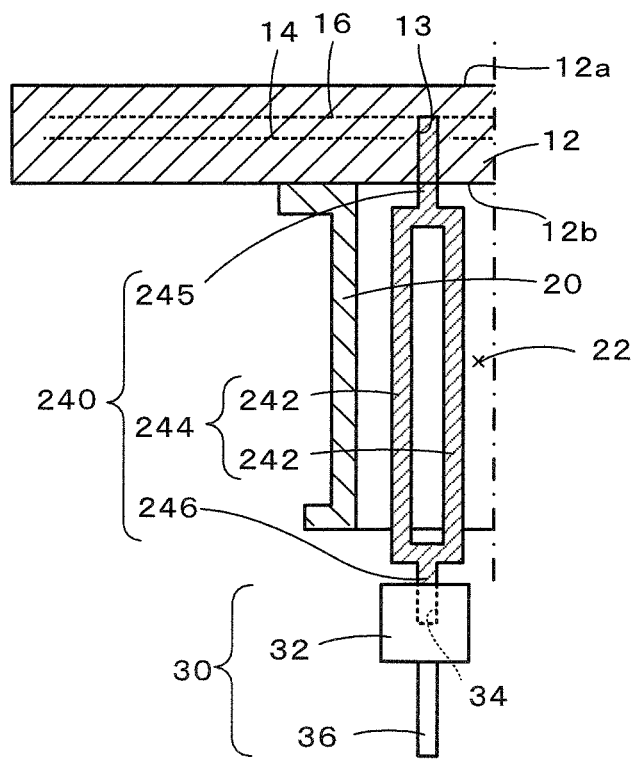
FIG. 3 is a longitudinal sectional view of an RF link member 240 and its vicinity.

Instead of the RF link member 40 according to the embodiment described above, an RF link member 240 illustrated in FIG. 3 may be employed. The same reference numerals are used in FIG. 3 to describe those constituent elements that are identical to the constituent elements in the embodiment described above. The RF link member 240 includes a branching portion 244 consisting of a plurality of RF rods 242 (two RF rods in this example) and a columnar first merged portion 245 in which the plurality of RF rods 242 are merged into one in front of the back surface 12*b* of the ceramic plate 12, and a columnar second merged portion 246 in which the plurality of RF rods 242 are merged into one in front of the RF connector 30. The upper ends of the RF rods 242 are merged into one rod at the first merged portion 245, which is connected to the RF electrode 16. The lower ends of RF rods 242 are merged into one rod at the second merged portion 246, which is inserted into the insertion hole 34 of the RF connector 30. The RF link member 240 extends from the RF electrode 16 to the RF connector 30 through the hollow interior 22 of the ceramic shaft 20. Part of the branching portion 244 is disposed in the hollow interior 22 of the ceramic shaft 20. The lower end of the RF link member 240 is at a position closer to the ceramic shaft 20 than the lower end of the heater rod 24 (refer to FIG. 1). In FIG. 3, when the RF link member 240 is connected to the RF electrode 16, the number of required holes 13 in the ceramic plate 12 can be reduced. In addition, when the RF link member 240 is connected to the RF connector 30, the number of required connecting portions (the insertion holes 34) can be reduced, as compared with the embodiment described above. Note that a plurality of the RF link members 240 may be provided between the RF electrode 16 and the RF connector 30. It is desirable that each of the RF rod 242 and the first and second merged portions 245, 246 be thicker than the heater rod 24. In this way, the surface area of each of the RF rod 242 and the first and second merged portions 245, 246 is increased, which decreases the resistance of the RF current flowing through the RF rod 242 and the first and second merged portions 245, 246. Thus, the amount of heat generated by the RF rod 242 and the first and second merged portions 245, 246 decreases.

Figure 4:
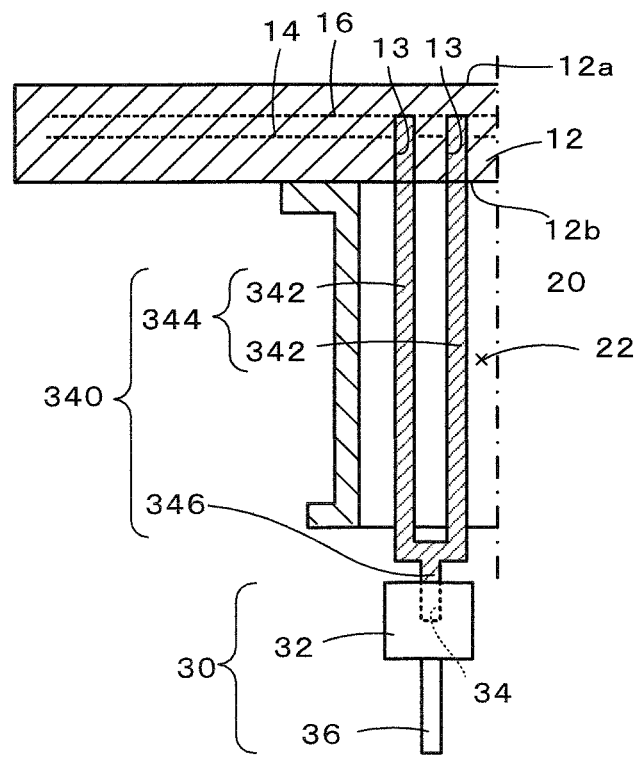
FIG. 4 is a longitudinal sectional view of an RF link member 340 and its vicinity.

Instead of the RF link member 40 according to the embodiment described above, an RF link member 340 illustrated in FIG. 4 may be employed. The same reference numerals are used in FIG. 4 to describe those constituent elements that are identical to the constituent elements in the embodiment described above. The RF link member 340 includes a branching portion 344 consisting of a plurality of RF rods 342 (two RF rods in this example) and a merged portion 346 in which the plurality of RF rods 342 are merged into one in front of the RF connector 30. The upper ends of the branched RF rods 342 are connected to the RF electrode 16. The lower ends of the RF rods 342 are merged into one at the merged portion 346, which is inserted into the insertion hole 34 of the RF connector 30. The RF link member 340 extends from the RF electrode 16 to the RF connector 30 through the hollow interior 22 of the ceramic shaft 20. Part of the branching portion 344 is disposed in the hollow interior 22 of the ceramic shaft 20. The lower end of the RF link member 340 is at a position closer to the ceramic shaft 20 than the lower end of the heater rod 24 (refer to FIG. 1). In FIG. 4, when the RF link member 340 is connected to the RF connector 30, the number of required connecting portions (the insertion holes 34) can be reduced, as compared with the embodiment described above. Note that a plurality of the RF link members 340 may be provided between the RF electrode 16 and the RF connector 30. It is desirable that each of the RF rod 342 and the merged portion 346 be thicker than the heater rod 24. In this way, the surface area of each of the RF rod 342 and the merged portion 346 is increased, which decreases the resistance of the RF current flowing through the RF rod 342 and the merged portion 346. Thus, the amount of heat generated by the RF rod 342 and the merged portion 346 decreases.

Figure 5:
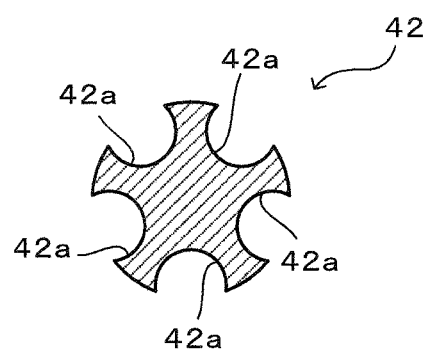
FIG. 5 is a cross-sectional view of a modification of an RF rod 42.

According to the embodiment described above, the cross section of the RF rod 42 (the cross section obtained by cutting the RF rod 42 in a direction perpendicular to the longitudinal direction) is circular. However, as illustrated in FIG. 5, the RF rod 42 may have a shape of cross section with at least one concave portion 42*a* (five concave portions in this example) at its periphery. More specifically, the RF rod 42 may have at least one groove (five grooves in this example) extending in the longitudinal direction. In this way, the surface area of the RF rod 42 is increased, as compared with the case where the concave portion 42*a* is not provided. As a result, an increase in resistance due to the skin effect is decreased more, and the amount of heat generated per RF rod is reduced more.

According to the embodiment described above, the shape of the RF electrode 16 is a mesh. However, another shape may be employed. For example, the RF electrode 16 may have a shape of a coil, a flat shape, or a shape of a punched metal.

According to the embodiment described above, AlN is used as the ceramic material. However, the ceramic material is not limited thereto. For example, alumina, silicon nitride, silicon carbide, or the like may be used. In this case, it is desirable that the material of each of the resistance heating element 14 and the RF electrode 16 has a coefficient of thermal expansion close to that of the ceramic.

According to the embodiment described above, the resistance heating element 14 and the RF electrode 16 are embedded in the ceramic plate 12. However, an electrostatic electrode may be further embedded. In this manner, the ceramic heater 10 further functions as an electrostatic chuck.

According to the embodiment described above, a one-zone heater in which the resistance heating element 14 is wired over the whole area of the ceramic plate 12 in a one-stroke pattern. However, the ceramic heater 10 is not limited thereto. For example, a multi-zone heater obtained by dividing the whole area of the ceramic plate 12 into a plurality of zones and wiring a resistance heating element for each zone in a one-stroke pattern may be adopted. In this case, a pair of heater rods can be provided for the resistance heating element in each zone.

Figure 6:
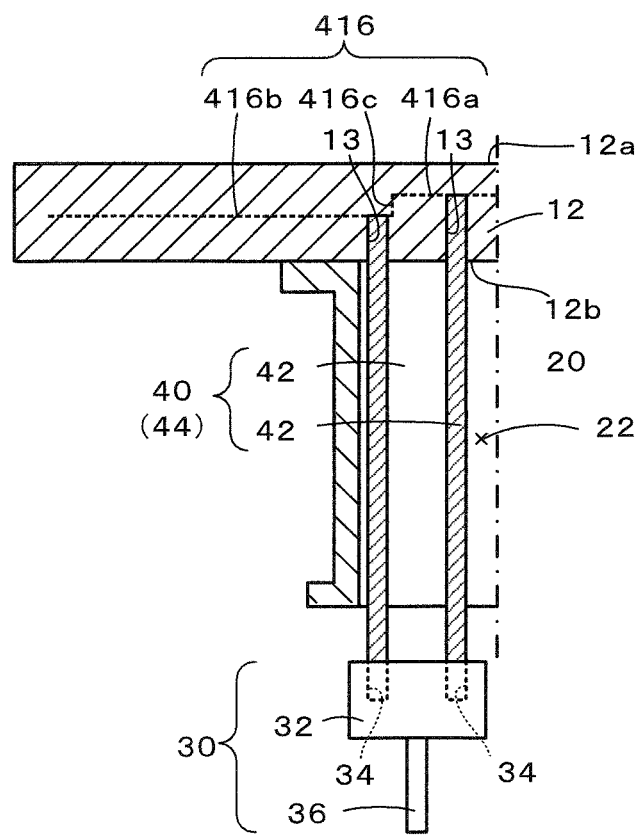
FIG. 6 is a longitudinal sectional view of a ceramic heater with an RF electrode 416.

Instead of the RF electrode 16 according to the embodiment described above, an RF electrode 416 illustrated in FIG. 6 may be employed. The same reference numerals are used in FIG. 6 to describe those constituent elements that are identical to the constituent elements in the embodiment described above. The RF electrode 416 is formed by connecting the outer periphery of an inner circular electrode 416a with the inner periphery of an outer ring-shaped electrode 416b by using a cylindrical connecting portion 416c. The inner circular electrode 416a and the outer ring-shaped electrode 416b are disposed on planes located at different heights in a two-tiered arrangement. One of two RF rods 42 that constitute the RF link member 40 (the branching portion 44) is connected to the back surface of the inner circular electrode 416a, and the other is connected to the back surface of the outer ring-shaped electrode 416b. That is, the two RF rods 42 are connected to two surfaces of the RF electrode 416 located at different heights, respectively. Even in this configuration, the same effect as in the embodiment described above can be obtained. In addition, since the RF electrode 416 is provided across a plurality of planes at different heights inside the ceramic plate 12, the density of the plasma can be changed for each of the surfaces of the RF electrodes 416 at different heights. Furthermore, since the two RF rods 42 are connected individually to the surfaces of the RF electrode 416, the distance between the two RF rods 42 can be ensured. For example, by increasing the distance between the two RF rods 42 each generating heat, it is possible to prevent the RF rods 42 from heating each other. Furthermore, since the RF rods 42 are respectively connected to the outer ring-shaped electrode 416b, which is close to the back surface 12b of the ceramic plate 12, and the inner circular electrode 416a, which is far from the back surface 12b, the depth of the hole of the RF rod 42 connected to the outer ring-shaped electrode 416b, which is close to the back surface 12b, is decreased, and the load of processing performed on the ceramic plate 12 is small, reducing the risk of breakage. In contrast, when two RF rods 42 are connected to the inner circular electrode 416a, which is far from the back surface 12b, the depth of the holes of the two RF rods 42 is large, increasing the load of processing performed on the ceramic plate 12 and increasing the risk of breakage. Note that in FIG. 6, like the embodiment described above, the resistance heating element 14 and the heater rod 24 may be provided. Furthermore, in FIG. 6, the RF link member 340 illustrated in FIG. 4 may be employed instead of the RF link member 40.

The present application claims priority from Japanese Patent Application No. 2019-146413 filed Aug. 8, 2019, the entire contents of which are incorporated herein by reference.

What is claimed is:

1. A member for semiconductor manufacturing apparatus, the member having a structure in which a hollow ceramic shaft is provided on a back surface of a ceramic plate having a front surface serving as a wafer placement surface, the member comprising:
   an RF electrode embedded in the ceramic plate;
   an RF connector including a socket and a RF base rod, wherein both the socket and the RF base rod are disposed outside of and under a lower opening of a hollow interior of the ceramic shaft; and
   an RF link member provided between the RF connector and the RF electrode,
   wherein the RF link member has a branching portion consisting of a plurality of RF rods, and the branching portion extends to the outside of and under a lower opening of the ceramic shaft.

2. The member for semiconductor manufacturing apparatus according to claim 1,
   wherein the upper ends of the plurality of RF rods are merged into one rod in a first merged portion located at an upper end of the hollow interior of the ceramic shaft in front of the back surface of the ceramic plate, and the one rod is connected to the RF electrode.

3. The member for semiconductor manufacturing apparatus according to claim 1,
   wherein the plurality of RF rods are individually connected to the RF electrode.

4. The member for semiconductor manufacturing apparatus according to claim 3,
   wherein the RF electrode is provided across a plurality of planes at different heights within the ceramic plate, and each of the plurality of RF rods is individually connected to one of the planes of the RF electrode.

5. The member for semiconductor manufacturing apparatus according to claim 1,
   wherein the plurality of RF rods are merged into one rod in a second merged portion in front of the RF connector, and the one rod is connected to the RF connector.

6. The member for semiconductor manufacturing apparatus according to claim 1,
   wherein the cross section obtained by cutting one of the RF rods in a direction perpendicular to the longitudinal direction of said RF rod has a shape with at least one concave portion in the periphery of the shape.

7. The member for semiconductor manufacturing apparatus according to claim 1, further comprising:
   a resistance heating element embedded in the ceramic plate; and
   a pair of heater rods connected to the resistance heating element, the pair of heater rods extending through the hollow interior of the ceramic shaft to the outside of the ceramic shaft,
   wherein a base end of the RF link member is located at a position closer to the ceramic shaft than base ends of the heater rods.

8. The member for semiconductor manufacturing apparatus according to claim 1, further comprising:
   a resistance heating element embedded in the ceramic plate; and
   a pair of heater rods connected to the resistance heating element, the pair of heater rods extending through the hollow interior of the ceramic shaft to the outside of the ceramic shaft,
   wherein each of the RF rods are thicker than each of the heater rods.

* * * * *